United States Patent
Nielson et al.

(10) Patent No.: US 11,714,221 B2
(45) Date of Patent: *Aug. 1, 2023

(54) DURABLE, HIGH PERFORMANCE WIRE GRID POLARIZER HAVING BARRIER LAYER

(71) Applicant: Moxtek, Inc., Orem, UT (US)

(72) Inventors: R. Stewart Nielson, Pleasant Grove, UT (US); Matthew C. George, Lindon, UT (US); Shaun Ogden, Saratoga Springs, UT (US); Brian Bowers, Kaysville, UT (US)

(73) Assignee: Moxtek, Inc., Orem, UT (US)

( * ) Notice: Subject to any disclaimer, the term of this patent is extended or adjusted under 35 U.S.C. 154(b) by 161 days.

This patent is subject to a terminal disclaimer.

(21) Appl. No.: 17/220,370

(22) Filed: Apr. 1, 2021

(65) Prior Publication Data

US 2021/0223450 A1    Jul. 22, 2021

Related U.S. Application Data

(63) Continuation of application No. 16/519,651, filed on Jul. 23, 2019, now Pat. No. 11,002,899, which is a
(Continued)

(51) Int. Cl.
*G02B 5/30* (2006.01)
*G02F 1/1335* (2006.01)
(Continued)

(52) U.S. Cl.
CPC ........ *G02B 5/3058* (2013.01); *C23C 14/0036* (2013.01); *C23C 14/081* (2013.01);
(Continued)

(58) Field of Classification Search
CPC .................. G02B 5/3058; G02F 1/133548
See application file for complete search history.

(56) References Cited

U.S. PATENT DOCUMENTS 7,961,393 B2    6/2011   Perkins et al.
8,576,672 B1   11/2013   Peng et al.
(Continued)

FOREIGN PATENT DOCUMENTS

WO    WO 2009/104861    8/2009

OTHER PUBLICATIONS

Accuratus; "Aluminum Oxide | $Al^2O^3$ Ceramic Properties;" Al2O3 Material Properties; (Jul. 29, 2016); 3 pages; [retrieved May 31, 2019]; Retrieved from <URL: https://accuratus.com/alumox.html>.
(Continued)

*Primary Examiner* — Ryan S Dunning
(74) *Attorney, Agent, or Firm* — Thorpe North & Western, LLP (57) ABSTRACT

A method for making a wire grid polarizer (WGP) can provide WGPs with high temperature resistance, robust wires, oxidation resistance, and corrosion protection. In one embodiment, the method can comprise: (a) providing an array of wires on a bottom protection layer; (b) applying a top protection layer on the wires, spanning channels between wires; then (c) applying an upper barrier-layer on the top protection layer and into the channels through permeable junctions in the top protection layer. In a variation of this embodiment, the method can further comprise applying a lower barrier-layer before applying the top protection layer. In another variation, the bottom protection layer and the top protection layer can include aluminum oxide. In another embodiment, the method can comprise applying on the WGP an amino phosphonate then a hydrophobic chemical.

19 Claims, 8 Drawing Sheets

Related U.S. Application Data continuation of application No. 16/150,478, filed on Oct. 3, 2018, now Pat. No. 10,408,983, which is a continuation-in-part of application No. 15/709,127, filed on Sep. 19, 2017, now Pat. No. 10,571,614, and a continuation-in-part of application No. 15/691,315, filed on Aug. 30, 2017, now Pat. No. 10,444,410, and a continuation-in-part of application No. 15/631,256, filed on Jun. 23, 2017, now Pat. No. 10,534,120.

(60) Provisional application No. 62/425,339, filed on Nov. 22, 2016, provisional application No. 62/375,675, filed on Aug. 16, 2016.

(51) Int. Cl.

| | |
|---|---|
| *G02B 1/14* | (2015.01) |
| *G02B 1/18* | (2015.01) |
| *C23C 14/12* | (2006.01) |
| *C23C 14/34* | (2006.01) |
| *C23C 14/08* | (2006.01) |
| *C23C 16/30* | (2006.01) |
| *C23C 14/58* | (2006.01) |
| *C23C 28/04* | (2006.01) |
| *C23C 16/455* | (2006.01) |
| *C23C 14/00* | (2006.01) |
| *C03B 19/14* | (2006.01) |

(52) U.S. Cl.
CPC .............. *C23C 14/12* (2013.01); *C23C 14/34* (2013.01); *C23C 14/345* (2013.01); *C23C 14/5873* (2013.01); *C23C 16/30* (2013.01); *C23C 16/45525* (2013.01); *C23C 28/04* (2013.01); *G02B 1/14* (2015.01); *G02B 1/18* (2015.01); *G02F 1/133548* (2021.01); *C03B 19/1438* (2013.01); *C03C 2218/10* (2013.01); *C03C 2218/111* (2013.01); *G02B 5/3025* (2013.01)

(56) References Cited

U.S. PATENT DOCUMENTS

| | | | |
|---|---|---|---|
| 8,755,113 | B2 | 6/2014 | Gardner et al. |
| 9,726,897 | B2 | 8/2017 | Huang et al. |
| 10,408,983 | B2 | 9/2019 | Nielson et al. |
| 10,444,410 | B2 | 10/2019 | Nielson et al. |
| 11,002,899 | B2 * | 5/2021 | Nielson .................. C23C 14/34 |
| 2003/0102286 | A1 | 6/2003 | Takahara et al. |
| 2003/0227678 | A1 | 12/2003 | Lines et al. |
| 2004/0218270 | A1 | 11/2004 | Wang |
| 2006/0087602 | A1 | 4/2006 | Kunisada et al. |
| 2007/0070276 | A1 | 3/2007 | Tan et al. |
| 2008/0152892 | A1 | 6/2008 | Edlinger et al. |
| 2008/0186576 | A1 * | 8/2008 | Takada ................. G02B 5/3025 349/5 |
| 2008/0316599 | A1 | 12/2008 | Wang et al. |
| 2009/0066885 | A1 | 3/2009 | Kumai |
| 2009/0109377 | A1 | 4/2009 | Sawaki et al. |
| 2009/0153961 | A1 | 6/2009 | Murakami et al. |
| 2010/0225832 | A1 | 9/2010 | Kumai |
| 2010/0225886 | A1 | 9/2010 | Kumai |
| 2012/0008205 | A1 | 1/2012 | Perkins et al. |
| 2012/0075699 | A1 | 3/2012 | Davis et al. |
| 2012/0225886 | A1 | 9/2012 | Edmondson et al. |
| 2012/0319222 | A1 | 12/2012 | Ozawa et al. |
| 2013/0148053 | A1 | 6/2013 | Minoura et al. |
| 2013/0250411 | A1 | 9/2013 | Bangerter et al. |
| 2013/0319522 | A1 | 12/2013 | Koike et al. |
| 2015/0062500 | A1 | 3/2015 | Park et al. |
| 2015/0160391 | A1 | 6/2015 | Tsuruoka et al. |
| 2016/6062017 | | 3/2016 | Nielson et al. |
| 2018/0052270 | A1 | 2/2018 | Nielson et al. |
| 2018/0059301 | A1 | 3/2018 | An et al. |
| 2018/0143364 | A1 | 5/2018 | Wang et al. |
| 2018/0259698 | A1 | 9/2018 | Neilson et al. |
| 2018/0267221 | A1 | 9/2018 | Oowada et al. |
| 2019/0041564 | A1 | 2/2019 | Nielson et al. |

OTHER PUBLICATIONS

Institute for Microelectronics; "2.1 Silicon Dioxide Properties;" www.iue.tuwien.ac.at; (Jan. 21, 2013); 4 pages; [retrieved May 31, 2019]; Retrieved from <URL: www.iue.tuwien.ac.at/phd/filipovic/node26.html >.

* cited by examiner

DURABLE, HIGH PERFORMANCE WIRE GRID POLARIZER HAVING BARRIER LAYER

CLAIM OF PRIORITY

This application is a continuation of U.S. patent application Ser. No. 16/519,651, filed on Jul. 23, 2019; which is a continuation of U.S. patent application Ser. No. 16/150,478, filed on Oct. 3, 2018; which is a continuation-in-part of U.S. patent application Ser. No. 15/709,127, filed on Sep. 19, 2017; U.S. patent application Ser. No. 15/691,315, filed on Aug. 30, 2017, which claims priority to U.S. Provisional Patent Application No. 62/425,339, filed on Nov. 22, 2016; and U.S. patent application Ser. No. 15/631,256, filed on Jun. 23, 2017, which claims priority to U.S. Provisional Patent Application No. 62/375,675, filed on Aug. 16, 2016; all of which are incorporated herein by reference.

FIELD OF THE INVENTION

The present application is related generally to wire gird polarizers.

BACKGROUND

Demand for improved wire grid polarizer (WGP) durability is increasing. For example, a WGP may need to withstand high temperatures, such as for example in newer computer projectors which are progressively becoming smaller and brighter with accompanying higher internal temperature.

Selectively-absorptive WGPs are particularly susceptible to damage due to high temperature because they absorb a large percent of incident light. Such WGPs typically have wires that include a reflective portion (e.g. aluminum) and an absorptive portion (e.g. silicon). The absorptive portion can absorb about 80%-90% of one polarization of light, and thus over 40% of the total amount of light. Much of the heat from this absorbed light conducts to the reflective portion of the wire, which can melt, thus destroying the WGP.

The wires in a visible light WGP can be narrow (about 30 nm) and tall (about 300 nm) and consequently delicate. It is difficult to protect these wires from toppling without degradation of WGP performance.

Oxidation of wires of a WGP can degrade or destroy WGP performance. As with protection from toppling, it is difficult to protect wires from oxidation without the protective mechanism degrading WGP performance.

It is also important to protect wires of the WGP from corrosion. Due to the nanometer-size of the wires, and high performance requirements, even a small amount of corrosion can make the WGP unsatisfactory. It is difficult to provide sufficient corrosion protection without causing performance to drop below minimum standards.

BRIEF DESCRIPTION OF THE DRAWINGS (DRAWINGS MIGHT NOT BE DRAWN TO SCALE)

DEFINITIONS

As used herein, the term "adjoin" means direct and immediate contact. As used herein, the terms "adjacent" and "located at" include adjoin, but also include near or next to with other solid material(s) between.

As used herein, the term "conformal coating" means a thin film which conforms to the contours of feature topology. For example, "conformal" can mean that a minimum thickness of the coating is ≥0.1 nm or ≥1 nm and a maximum thickness of the coating is ≤10 nm, ≤25 nm, or ≤40 nm. As another example, "conformal" can mean that a maximum thickness divided by a minimum thickness of the coating is ≤20, ≤10, ≤5, or ≤3.

As used herein "continuous" means a layer which may include some discontinuity, such as pinholes, but no major discontinuity, such as a division into a grid or separate wires.

As used herein, the term "equal" with regard to thicknesses means exactly equal, equal within normal manufacturing tolerances, or nearly equal, such that any deviation from exactly equal would have negligible effect for ordinary use of the device.

As used herein, the term "nm" means nanometer(s), the term μm means micrometer(s), and the term "mm" means millimeter(s).

As used herein, the term "parallel" means exactly parallel, parallel within normal manufacturing tolerances, or nearly parallel, such that any deviation from exactly parallel would have negligible effect for ordinary use of the device.

The terms "upper", "lower", "top", and "bottom" are for convenience in referring to the drawings and for distinguishing different WGP components, but the WGP may be spatially arranged in any configuration.

Materials used in optical structures can absorb some light, reflect some light, and transmit some light. The following definitions distinguish between materials that are primarily absorptive, primarily reflective, or primarily transparent. Each material can be considered to be absorptive, reflective, or transparent in a specific wavelength range (e.g. ultraviolet, visible, or infrared spectrum) and can have a different property in a different wavelength range. Thus, whether a material is absorptive, reflective, or transparent is dependent on the intended wavelength range of use. Materials are divided into absorptive, reflective, and transparent based on reflectance R, the real part of the refractive index n, and the imaginary part of the refractive index/extinction coefficient k. Equation 1 is used to determine the reflectance R of the interface between air and a uniform slab of the material at normal incidence:

$$R = \frac{(n-1)^2 + k^2}{(n+1)^2 + k^2} \quad \text{Equation 1}$$

Unless explicitly specified otherwise herein, materials with k≤0.1 in the specified wavelength range are "transparent" materials, materials with k≥0.1 and R≤0.6 in the specified wavelength range are "absorptive" materials, and materials with k≥0.1 and R≥0.6 in the specified wavelength range are "reflective" materials. If not explicitly specified in the claims, then the material is presumed to have the property of transparent, absorptive, or reflective across the visible wavelength range.

DETAILED DESCRIPTION

As illustrated in FIGS. 1-8, each wire grid polarizer (WGP) can include an array of wires 12. The wires 12 can be made of or can include materials for polarization of light, including metals and/or dielectrics, as are typically used in wires of wire grid polarizers. See for example U.S. Pat. Nos. 7,961,393 and 8,755,113, which are incorporated herein by reference.

As illustrated in FIGS. 1-6, the array of wires 12 can be sandwiched between a pair of protection layers 14, including a top protection layer 14$_U$ and a bottom protection layer 14$_L$. The protection layers 14 can have a flat, planar shape.

The protection layers 14 can provide the following benefits: increased resistance to high temperature, protection of the wires 12 from toppling, protection of the wires against oxidation, protection of the wires against corrosion, or combinations thereof. As described in the various embodiments herein, this protection may be achieved with little or no degradation of WGP performance.

The protection layers 14 can have a high coefficient of thermal conductivity to conduct heat away from the wires 12. For example, one or both of the protection layers 14 can have a coefficient of thermal conductivity of ≥2 W/(m*K), ≥2.5 W/(m*K), ≥4 W/(m*K), ≥5 W/(m*K), ≥10 W/(m*K), ≥15 W/(m*K), ≥20 W/(m*K), or ≥25 W/(m*K). All coefficient of thermal conductivity values specified herein are the value at 25° C.

The protection layers 14 can have a high melting temperature to improve heat resistance. For example, one or both of the protection layers 14 can have a melting temperature of ≥600° C., ≥1000° C., ≥1500° C., or ≥1900° C.

The protection layers 14 can have a high Young's modulus in order to provide structural support for the wires 12. For example, the material of one or both of the protection layers 14 can have a Young's modulus of ≥1 GPa, ≥10 GPa, ≥30 GPa, ≥100 GPa, or ≥200 GPa.

The protection layers 14 can extend at least partially along the side-wall surfaces 12$_s$ of the wires 12 in the channels 13; therefore, these protection layers 14 can provide protection to these side-wall surfaces 12$_s$. Thus, it can be important for the protection layers 14 to have a low oxygen diffusion coefficient and thus provide added oxidation protection for the wires 12. It can thus be beneficial if the oxygen diffusion coefficient of the protection layers 14 is ≤10$^{-20}$ m²/s, ≤10$^{-21}$ m²/s, ≤10$^{-22}$ m²/s, ≤10$^{-23}$ m²/s, or ≤10$^{-24}$ m²/s, all measured at 325° C.

Corrosion from condensed water is a common failure mechanism for WGPs. It can therefore be helpful for the protection layers 14 to be insoluble in water. Thus, for example, water solubility of the protection layers 14 can be ≤1 g/L, ≤0.1 g/L, ≤0.01 g/L, or ≤0.005 g/L, ≤0.001 g/L, all measured at 25° C.

It can be important for the protection layers 14 to have minimal adverse effect, or even improve, performance of the WGP. Optimal refractive index n and extinction coefficient k can vary depending on overall WGP design. Following are exemplary values of the refractive index n and the extinction coefficient k for the protection layers 14 across the infrared, visible light, or ultraviolet spectrum of light: n≥1.1 or n≥1.3; n≤1.8, n≤2.0, n≤2.2, or n≤2.5; and k≤0.1, k≤0.06, or k≤0.03.

The protection layer 14 can have high electrical resistivity. For example, the protection layer 14 can have electrical resistivity of ≥$10^4$ Ω*cm, ≥$10^5$ Ω*cm, ≥$10^6$ Ω*cm, ≥$10^7$ Ω*cm, ≥$10^8$ Ω*cm, ≥$10^9$ Ω*cm, or ≥$10^{10}$ Ω*cm. Some materials can function well as the protection layer 14 without such a high electrical resistivity. For example, the protection layer 14 can have electrical resistivity of ≥0.0001 Ω*cm or ≥0.0005 Ω*cm and ≤1 Ω*cm or ≤100 Ω*cm. The electrical resistivity values specified herein are the electrical resistivity at 20° C.

Example materials for the protection layer(s) 14, which meet at least some of the above criteria, include zinc oxide, silicon dioxide, aluminum-doped zinc oxide, aluminum nitride, and aluminum oxide. For example, one protection layer 14 or both protection layers 14 can comprise ≥50%, ≥75%, ≥90%, ≥95%, or ≥99% zinc oxide, silicon dioxide, aluminum-doped zinc oxide, aluminum nitride, or aluminum oxide. Due to imperfections in deposition of material, these materials can be deposited in nonstoichiometric ratios. Therefore, the term aluminum oxide ($Al_2O_3$) used herein means approximately two aluminum atoms for every three oxygen atoms, such as for example $Al_xO_y$, where 1.9≤x≤2.1 and 2.9≤y≤3.1. The term aluminum nitride (AlN) used herein means approximately one aluminum atom for every one nitrogen atom, such as for example $Al_mN_n$, where 0.9≤m≤1.1 and 0.9≤n≤1.1. The term zinc oxide (ZnO) used herein means approximately one zinc atom for every one oxygen atom, such as for example $Zn_iO_j$, where 0.9≤i≤1.1 and 0.9≤j≤1.1.

Selection of a thickness $Th_{14U}$ of the top protection layer $14_U$ and a thickness $Th_{14L}$ of the bottom protection layer $14_L$ can improve the ability of these protection layers 14 to provide the needed protection to the WGP with reduced detrimental effect to WGP performance, improved manufacturability, and reduced cost. These thicknesses $Th_{14U}$ and $Th_{14L}$ can vary depending on specific application.

In some applications, for WGP symmetry, the thickness $Th_{14U}$ of the top protection layer $14_U$ can equal, or be very close to, the thickness of the $Th_{14L}$ bottom protection layer $14_L$. This design can be beneficial for interferometry and 3D projection displays as described more fully in U.S. Pat. No. 9,726,897. For example, $|Th_{14L}-Th_{14U}|≤1$ nm, $|Th_{14L}-Th_{14U}|≤10$ nm, or $|Th_{14L}-Th_{14U}|≤100$ nm.

In other applications, particularly for applications requiring minimal or no projected image distortion, it can be beneficial for the thickness $Th_{14U}$ of the top protection layer $14_U$ to be substantially different from the thickness of the $Th_{14L}$ bottom protection layer $14_L$. For example, $Th_{14L}/Th_{14U}≥10$, $Th_{14L}/Th_{14U}≥100$, $Th_{14L}/Th_{14U}≥1000$, or $Th_{14L}/Th_{14U}≥2000$; and $Th_{14L}/Th_{14U}≥10,000$ or $Th_{14L}/Th_{14U}≤100,000$.

Examples of the thickness $Th_{14U}$ of the top protection layer $14_U$ include ≥10 nm, ≥100 nm, ≥1 μm, ≥10 μm, ≥100 μm, ≥300 μm, or ≥600 μm; and ≤300 nm, ≤1 μm, ≤1 mm, or ≤5 mm. Examples of the thickness $Th_{14L}$ of the bottom protection layer $14_L$ include ≥10 nm, ≥100 nm, ≥1 μm, ≥10 μm, ≥100 μm, ≥300 μm, or ≥600 μm; and ≤300 nm, ≤1 μm, ≤1 mm, or ≤5 mm.

Each wire 12 of the array can include a proximal end $12_p$ closest to the bottom protection layer $14_L$ and a distal end closest to the top protection layer 14u. The array of wires 12 can be parallel. The wires 12 can also be elongated. As used herein, the term "elongated" means that a length of the wires 12 is substantially greater than wire width $W_{12}$ or wire thickness $Th_{12}$ (see WGP 10 in FIG. 1). The wire length is the dimension extending into the page of the figures. For example, the wire length can be ≥10 times, ≥100 times, ≥1000 times, or ≥10,000 times larger than wire width Wiz, wire thickness $Th_{12}$, or both.

Channels

The array of wires 12 can include alternating wires 12 and channels 13, with a channel 13 between each pair of adjacent wires 12. The protection layers 14 can span the channels 13 and either not extend into the channels 13 or extend only minimally into the channels 13. Thus, the channels 13 can be air-filled for improved WGP performance.

The size of the channels 13 can be increased for improved WGP performance. As illustrated on WGP 20 in FIG. 2, each channel 13 can extend beyond the proximal end $12_p$ of the wires 12 into the bottom protection layer $14_L$ for a depth $D_{14L}$, beyond the distal end $12_d$ of the wires 12 into the top protection layer $14_U$ for a depth $D_{14U}$, or both. Each of these extensions of the channels 13 into the protection layers 14, to increase the size of the channels, can improve WGP performance due to an increased volume of low-index air in the channels 13.

Figure 1:
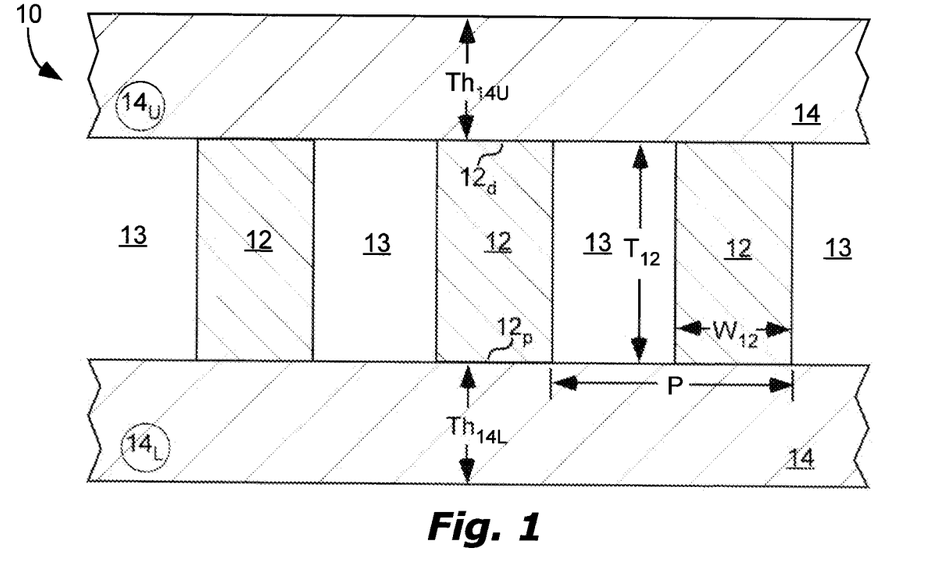
FIG. 1 is a schematic, cross-sectional side-view of a wire grid polarizer (WGP) 10, comprising an array of wires 12 (length extending into the page) sandwiched between a pair of protection layers 14, including a top protection layer $14_U$ and a bottom protection layer $14_L$, in accordance with an embodiment of the present invention.
Figure 2:
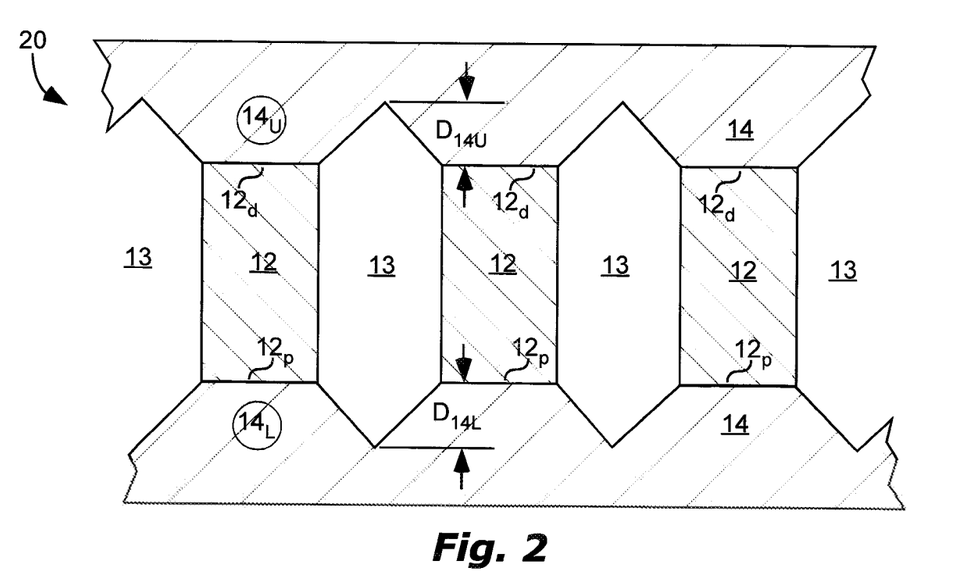
FIG. 2 is a schematic, cross-sectional side-view of a WGP 20, similar to WGP 10, further comprising each channel 13 extending beyond a proximal end $12_p$ of the wires 12 into the bottom protection layer $14_L$ and beyond a distal end $12_d$ of the wires 12 into the top protection layer $14_U$, in accordance with an embodiment of the present invention.

A value for each of these depths $D_{14L}$ and $D_{14U}$, and a relationship between these depths $D_{14L}$ and $D_{14U}$, can vary depending on the application. Following are some examples such values and relationships which have proven effective in certain designs: $D_{14L}≥1$ nm, $D_{14L}≥5$ nm, $D_{14L}≥10$ nm, $D_{14L}≥30$ nm; $D_{14L}≤50$ nm, $D_{14L}≤100$ nm, $D_{14L}≤200$ nm, $D_{14L}≤500$ nm; $D_{14U}≥1$ nm, $D_{14U}≥5$ nm, $D_{14U}≥10$ nm, $D_{14U}≥30$ nm; $D_{14U}≤50$ nm, $D_{14U}≤100$ nm, $D_{14U}≤200$ nm, $D_{14U}≤500$ nm; $|D_{14L}-D_{14U}|≤1$ nm; and $|D_{14L}-D_{14U}|≤5$ nm, $|D_{14L}-D_{14U}|≤10$ nm, $|D_{14L}-D_{14U}|≤20$ nm, $|D_{14L}-D_{14U}|≤30$ nm, $|D_{14L}-D_{14U}|≤50$ nm, or $|D_{14L}-D_{14U}|≤200$ nm. These depths $D_{14L}$ and $D_{14U}$ are measured in a direction parallel to the thickness $T_{12}$ of the wires 12. A method for increasing the size of the channels 13 is described below in the method of making section.

Lower Barrier-Layer

Figure 3:
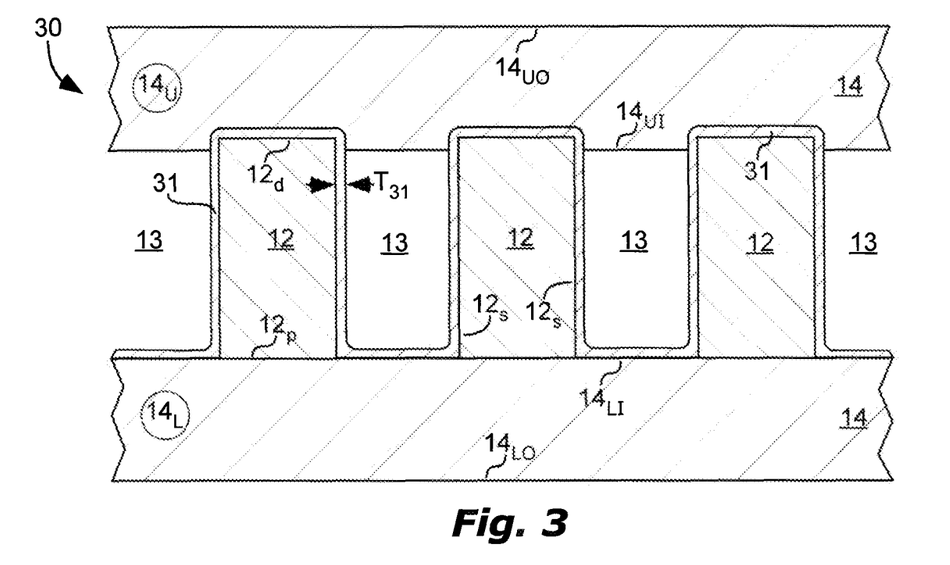
FIG. 3 is a schematic, cross-sectional side-view of a WGP 30, similar to the WGPs of FIGS. 1-2, further comprising a lower barrier-layer 31 at a side-wall surface $12_s$ of the wires 12 in the channels 13, a surface $14_{LI}$ of the bottom protection layer $14_L$ in the channels 13, and between the distal end $12_d$ each wire 12 and the top protection layer $14_U$, in accordance with an embodiment of the present invention.

As illustrated on WGP 30 in FIG. 3, a lower barrier-layer 31 can be located between the distal end $12_d$ of each wire 12 and the top protection layer $14_U$, a side-wall surface $12_s$ of the wires 12 in the channels 13, a surface $14_{LI}$ of the bottom protection layer $14_L$ in the channels 13, or combinations thereof. The lower barrier-layer 31 can be a conformal coating. The lower barrier-layer 31 can cover a large percent of the covered regions, such as for example ≥50%, ≥75%, ≥90%, or ≥99%. The amount of coverage can depend on tool used for application and thickness $T_{31}$ of the lower barrier-layer 31.

The lower barrier-layer 31 can be absent or not located between each wire 12 and the bottom protection layer $14_L$, which can improve adhesion of the wires 12 to the bottom protection layer $14_L$ and reduce chemical cost. Thus, the proximal end $12_p$ of each wire 12 can adjoin the bottom protection layer $14_L$. Furthermore, the lower barrier-layer 31 can be absent or not located at an outermost surface $14_{UO}$ of the top protection layer $14_U$, an outermost surface $14_U$ of the bottom protection layer $14_L$, or both. The lower barrier-layer 31 can be absent or not located at an innermost surface $14_{UI}$ of the top protection layer 14U adjacent and facing the channels 13, which can improve adhesion of the upper barrier-layer 41 (described below) to the top protection layer $14_U$.

The lower barrier-layer 31 can include various chemicals to protect against oxidation, corrosion, or both. For example, the lower barrier-layer 31 can include aluminum oxide, silicon oxide, silicon nitride, silicon oxynitride, silicon carbide, hafnium oxide, zirconium oxide, a rare earth oxide, or combinations thereof. The lower barrier-layer 31 can include other metal oxides or layers of different metal oxides.

In one embodiment, for both oxidation protection and corrosion protection, the lower barrier-layer 31 can comprise two layers of different materials, including an oxidation-barrier and a moisture-barrier. The oxidation-barrier can be located between the moisture-barrier and the wires. The oxidation-barrier can be distinct from the wires and can include aluminum oxide, silicon oxide, silicon nitride, silicon oxynitride, silicon carbide, a rare earth oxide, or combinations thereof. The moisture-barrier can include hafnium oxide, zirconium oxide, a rare earth oxide different from the rare earth oxide of the oxidation-barrier, or combinations thereof. Examples of rare earth oxides in the lower barrier-layer 31 include oxides of scandium, yttrium, lanthanum, cerium, praseodymium, neodymium, promethium, samarium, europium, gadolinium, terbium, dysprosium, holmium, erbium, thulium, ytterbium, and lutetium.

The lower barrier-layer 31 can be distinct from the wires 12, meaning (a) there can be a boundary line or layer between the wires 12 and the lower barrier-layer 31; or (b) there can be some difference of material of the lower barrier-layer 31 relative to a material of the wires 12. For example, a native aluminum oxide can form at a surface of aluminum wires 12. A layer of aluminum oxide (oxidation-barrier) can then be applied to the wires. This added layer of aluminum oxide can be important, because a thickness and/or density of the native aluminum oxide can be insufficient for protecting a core of the wires 12 (e.g. substantially pure aluminum) from oxidizing. In this example, although the oxidation-barrier ($Al_2O_3$) has the same material composition as a surface ($Al_2O_3$) of the wires 12, the oxidation-barrier can still be distinct due to a boundary layer between the oxidation-barrier and the wires 12, a difference in material properties, such as an increased density of the oxidation-barrier relative to the native aluminum oxide, or both.

Upper Barrier-Layer

Figure 4:
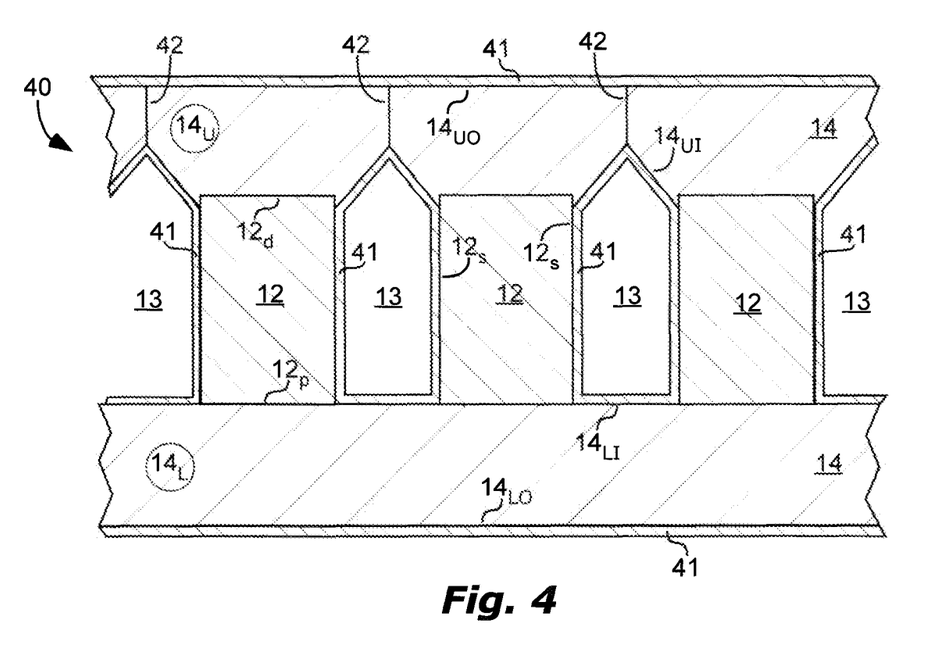
FIG. 4 is a schematic, cross-sectional side-view of a WGP 40, similar to the WGPs of FIGS. 1-2, further comprising an upper barrier-layer 41 located at an outermost surface $14_{UO}$ of the top protection layer $14_U$, at an outermost surface $14_{LO}$ of the bottom protection layer $14_L$, at surfaces of the channels 13, or combinations thereof, in accordance with an embodiment of the present invention.

As illustrated on WGP 40 in FIG. 4, an upper barrier-layer 41 can be located at an outermost surface $14_{UO}$ of the top protection layer $14_U$, at an outermost surface $14_{LO}$ of the bottom protection layer $14_L$, at some or all surfaces of the channels 13, or combinations thereof. Such surfaces of the channels 13 can include an innermost surface $14_{UI}$ of the top protection layer $14_U$ adjacent and facing the channels 13, a surface $14_{LI}$ of the bottom protection layer $14_L$ in the channels 13, and a side-wall surface $12_S$ of the wires in the channels 13. Having the upper barrier-layer 41 in these locations can allow it to protect many or all exposed surfaces of the protection layer(s) 14. For improved adhesion of the wires 12 to the protection layer(s) 14, the upper barrier-layer 41 can be absent or not located between the proximal end $12_p$ of each wire 12 and the bottom protection layer $14_L$, between the distal end $12_d$ of each wire 12 and the top protection layer $14_U$, or both.

The upper barrier-layer 41 can be a conformal coating. The upper barrier-layer 41 can cover a large percent of the covered regions, such as for example ≥50%, ≥75%, ≥90%, ≥95%, or ≥99% of covered regions ($14_{UO}$, $14_{LO}$, surfaces of the channels 13, or combinations thereof). The amount of coverage can depend on conditions of WGP use and on whether complete coverage is required.

The upper barrier-layer 41 can include various chemicals to protect against oxidation, corrosion, or both. Many desirable chemicals for the upper barrier-layer 41 can be destroyed by heat during deposition of the top protection layer $14_U$; therefore, it may be desirable to first apply the top protection layer $14_U$, then apply the upper barrier-layer 41. It can be important for providing structural support to the wires 12 for the top protection layer $14_U$ to be a continuous layer. The top protection layer $14_U$ can be applied in a continuous layer, with the top protection layer $14_U$ on each wire 12 touching the top protection layer $14_U$ on adjacent wires, but with a permeable junction 42 between the top protection layer $14_U$ on adjacent wires 12. This permeable junction 42 can have small spaces to allow chemistry of the upper barrier-layer 41 to enter and coat the surfaces of the channels 13; but these permeable junctions 42 can be small enough to not adversely affect structural support for the wires 12. The top protection layer $14_U$ can be applied with these characteristics by the procedures described below in the method of making section.

The upper barrier-layer 41 can include an amino phosphonate a hydrophobic chemical, a metal oxide such as those described above for the lower barrier-layer 31, or combinations thereof. The amino phosphonate can be nitrilotri(methylphosphonic acid) with chemical formula $N[CH_2PO(OH)_2]_3$, also known as ATMP. Combining both ATMP and the hydrophobic chemical can improve protection of the WGP initially and long-term. The hydrophobic chemical can provide superior resistance to water initially, but can also break down more quickly under high temperatures during use of the WGP. The ATMP can be more resistant to heat and thus provide protection for a longer time than the hydrophobic chemical. The ATMP can be a lower layer, sandwiched between the hydrophobic chemical and the wires 12.

The mass fraction of ATMP/hydrophobic chemical can vary depending on the cost of each and whether initial WGP protection or long-term WGP protection is more critical. For example, this mass fraction can be ≤10, ≤5, or ≤2 and ≥1, ≥0.5, or ≥0.1.

Examples of the hydrophobic chemical include a silane chemical, a phosphonate chemical, or both. For example, the silane chemical can have chemical formula (1), chemical formula (2), or combinations thereof, and the phosphonate chemical can have chemical formula (3):

where r can be a positive integer, each $R^1$ independently can be a hydrophobic group, each X and Z can be a bond to the wires 12, and each $R^3$ and $R^5$ can be independently any chemical element or group.

Examples of $R^3$ and $R^5$ include a reactive-group, $R^1$, $R^6$, or a bond to the wires X or Z. Examples of the reactive-group include —Cl, —$OR^7$, —$OCOR^7$, —$N(R^7)_2$, or —OH. Each $R^7$ can independently be —$CH_3$, —$CH_2CH_3$, —$CH_2CH_2CH_3$, any other alkyl group, an aryl group, or combinations thereof.

Examples of $R^1$ include a carbon chain, a carbon chain with at least one halogen, a carbon chain with a perfluorinated group, or combinations thereof. Examples of a length of the carbon chain or of the perfluorinated group of the carbon chain include ≥3 carbon atoms, ≥5 carbon atoms, ≥7 carbon atoms, or ≥9 carbon atoms and ≤11 carbon atoms, ≤15 carbon atoms, ≤20 carbon atoms, ≤30 carbon atoms, or ≤40 carbon atoms. A carbon atom of the carbon chain can bond directly to the Si atom or to the P atom. $R^1$ can comprise or consist of $CF_3(CF_2)_n(CH_2)_m$, where n≥1, n≥2, n≥3, n≥5, or n≥7 and n≤8, n≤9, n≤10, n≤15, or n≤20; and m≥1, m≥2, or m≥3 and m≤3, m≤4, m≤5, or m≤10.

Figure 5:
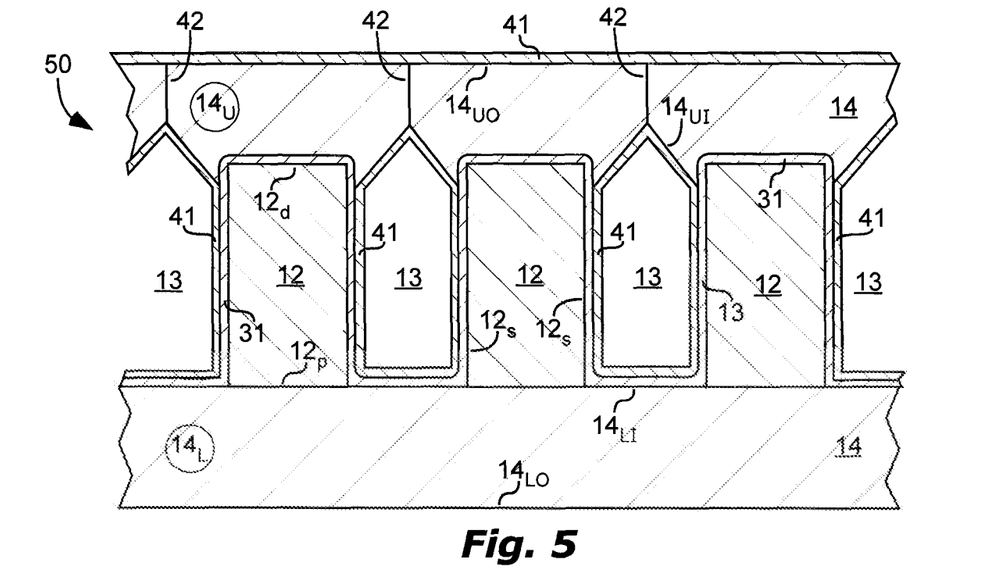
FIG. 5 is a schematic, cross-sectional side-view of a WGP 50, with a lower barrier-layer 31 (see FIG. 3) and an upper barrier-layer 41 (see FIG. 4), in accordance with an embodiment of the present invention.
Figure 6:
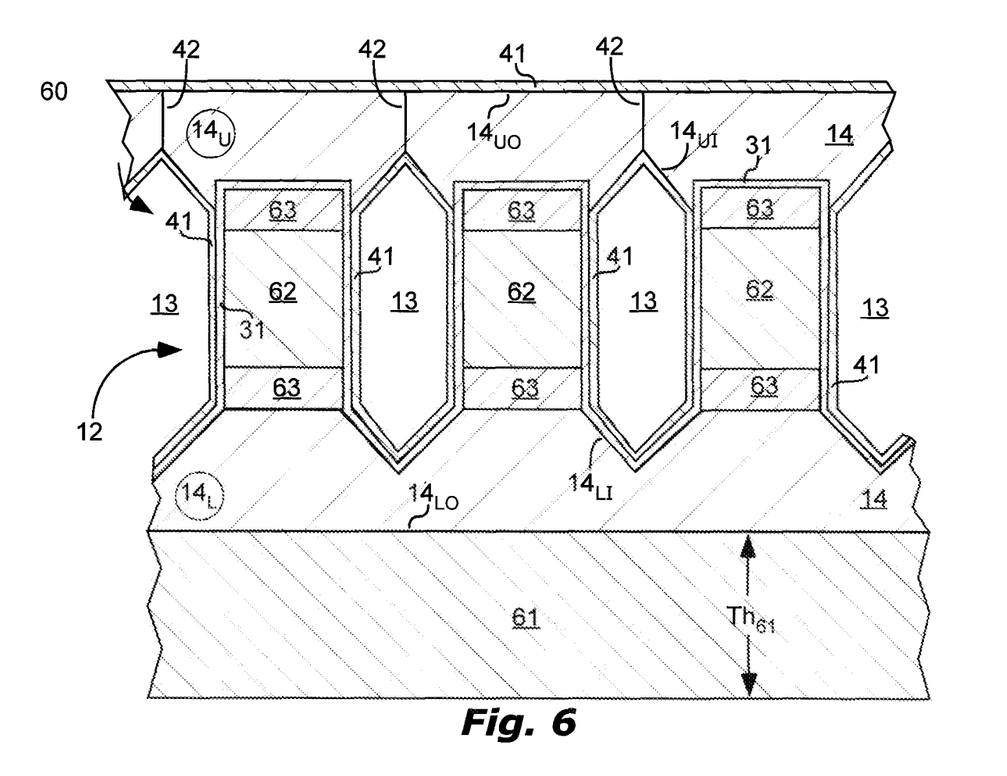
FIG. 6 is a schematic, cross-sectional side-view of a WGP 60, similar to the WGPs of FIGS. 1-5, further comprising each of the wires 12 including a reflective layer 62 sandwiched between absorptive layers 63, in accordance with an embodiment of the present invention.

The lower barrier-layer 31 can be an outermost layer of solid material as shown in FIG. 3, and can be exposed to air. Alternatively, the upper barrier-layer 41 can be an outermost layer of solid material and can be exposed to air as shown in FIGS. 4-7. As illustrated in FIGS. 5-6, the lower barrier-layer 31 can be combined with the upper barrier-layer 41. This combination can provide superior protection against oxidation and corrosion, but also adds cost to the WGP.

The lower barrier-layer 31, the upper barrier-layer 41, or both can be a conformal-coating. Use of a conformal-coating can result in a smaller chemical thickness $T_{31}$ or $T_{41}$, thus saving cost and reducing any detrimental effect of the chemical on WGP performance.

Barrier-Layer Thickness

It can be important to have sufficiently large thickness $T_{31}$ of the lower barrier-layer 31, sufficient thickness $T_{41}$ of the upper barrier-layer 41, or both, in order to provide sufficient protection to the wires 12. Examples of minimum thicknesses $T_{31}$ or $T_{41}$ include ≥0.1 nm, ≥0.5 nm, ≥1 nm, ≥5 nm, or ≥10 nm. It can be important to have a small thickness $T_{31}$ of the lower barrier-layer 31, a small thickness $T_{41}$ of the upper barrier-layer 41, or both, in order to avoid or minimize degradation of WGP performance caused by this chemistry. Examples of maximum thicknesses $T_{31}$ or $T_{41}$ include ≤12 nm, ≤15 nm, ≤20 nm, or ≤50 nm. These thickness values can be a minimum thickness or a maximum thickness at any location of the conformal-coating or can be an average thickness, as specified in the claims.

Absorptive

As illustrated on WGP 60 in FIG. 6, each of the wires 12 can include a reflective layer 62 sandwiched between absorptive layers 63. Because the absorptive layers 63 readily increase in temperature as they absorb light, it can be particularly useful to sandwich the wires 12 of dual absorptive WGPs between a pair of protection layers 14. For improved heat transfer, each absorptive layer 63 can adjoin a protection layer 14.

The protection layers 14 can be heat sinks for heat absorbed by the absorptive layers 63. Increased volume of the protection layers 14 can be beneficial to allow sufficient volume for absorption of this heat. Thus, for example, a volume of each of the protection layers 14 can be ≥2 times, ≤3 times, ≥5 times, ≥8 times, ≥12 times, or ≥18 times a volume of each absorptive layer 63.

Substrate, Single Barrier-Layer, No Barrier-Layer

As further illustrated on WGP 60 in FIG. 6, a substrate 61 can be adjacent to or can adjoin the outermost surface $14_{LO}$ of the bottom protection layer $14_L$. The substrate 61 can be made of an optically transparent material for the wavelength range of use, such as for example ultraviolet, visible, infrared, or combinations thereof. The substrate 61 can have a thickness $Th_{61}$ and material for providing structural support for the wires 12 and the protection layers 14. For example, the thickness $th_{61}$ can be ≥0.1 mm, ≥0.3 mm, ≥0.5 mm, or ≥0.65 mm. The added substrate 61 might not be needed if the protection layers 14 provide sufficient structural support for the wires 12. Performance can be improved and cost reduced by such a design.

Figure 7:
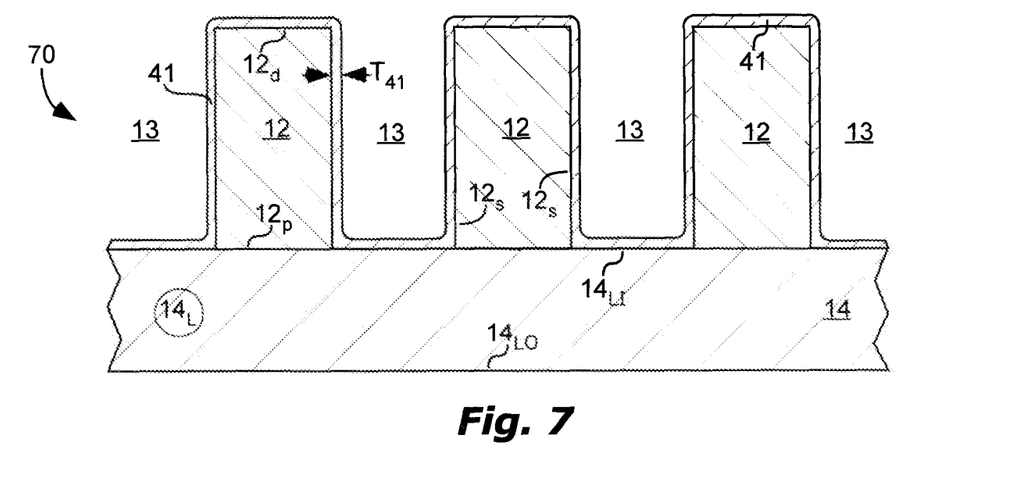
FIG. 7 is a schematic, cross-sectional side-view of WGP 70, comprising an array of wires 12 on a protection layer 14, and an upper barrier-layer 41 on the wires 12 and on the protection layer 14, in accordance with an embodiment of the present invention.

As shown on in FIG. 7, WGP 70 can include an array of wires 12 on a single protection layer 14. An upper barrier-layer 41, including a hydrophobic chemical, ATMP, or both, as described above, can be a conformal coating on the wires 12 and an exposed surface of the substrate 61. WGP 70 can also include the lower barrier-layer 31 between the upper barrier-layer 41 and the wires.

Figure 8:
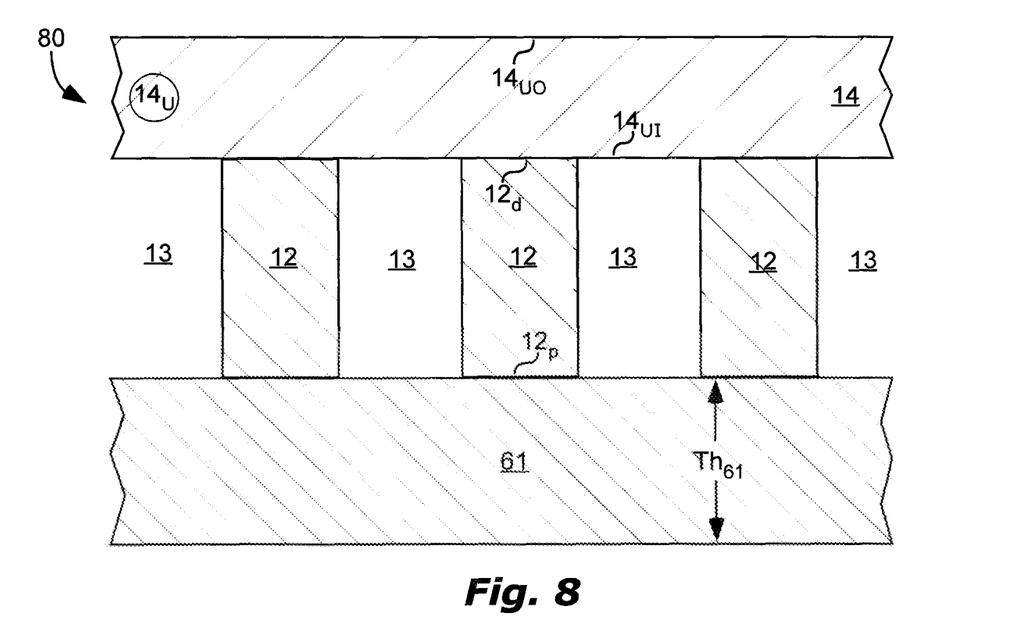
FIG. 8 is a schematic, cross-sectional side-view of WGP 80, comprising an array of wires 12 sandwiched between a top protection layer $14_U$ and a substrate 61, in accordance with an embodiment of the present invention.

As shown on in FIG. 8, WGP 80 can include an array of wires 12 sandwiched between a substrate 61 and a single protection layer 14. WGP 80 can be a lower cost WGP.

Optical System

Figure 9:
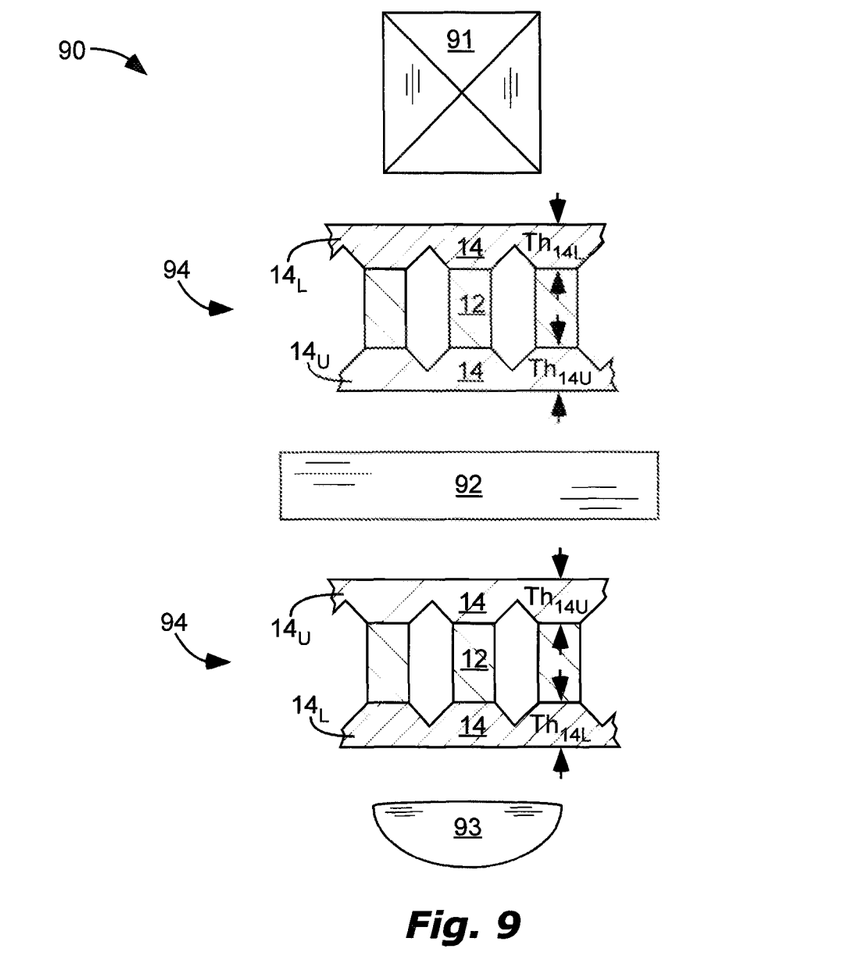
FIG. 9 is a schematic, cross-sectional side-view of an optical system 90, comprising at least one WGP 94 according to a design described herein, in accordance with an embodiment of the present invention.

Optical system 90, illustrated in FIG. 9, comprises at least one WGP 94 according to a design described herein and a spatial light modulator 92. If two WGPs 94 are used, the spatial light modulator 92 can be located between them.

If the bottom protection layer $14_L$ is thicker than the top protection layer $14_U$, the top protection layer $14_U$ can face the spatial light modulator 92 and can be located closer to the spatial light modulator 92 than the bottom protection layer $14_L$. Having the thicker protection layer 14 facing away from the spatial light modulator 92 can minimize distortion of the light.

Light from a light source 93 can be polarized at the WGP. The spatial light modulator 92 can be located to receive a transmitted or reflected light beam from the WGP 94. The spatial light modulator 92 can have a plurality of pixels, each pixel capable of receiving a signal. The signal can be an electronic signal. Depending on whether or not each pixel receives the signal, or the strength of the signal, the pixel can rotate a polarization of, or transmit or reflect without causing a change in polarization of, a part of the beam of light. The spatial light modulator 92 can include liquid crystal and can be transmissive, reflective, or transflective.

Light from the spatial light modulator 92 can be polarized at a second WGP 94, if two WGPs are used. The light can then enter device 91, which can be a projection system or color-combining optics, such as for example an X-Cube.

Method

A method of manufacturing a WGP can comprise some or all of the following steps, which can be performed in the following order or other order if so specified. Some of the steps can be performed simultaneously unless explicitly noted otherwise in the claims. There may be additional steps not described below. These additional steps may be before, between, or after those described. Components of the WGP, and the WGP itself, can have properties as described above.

Figure 10:
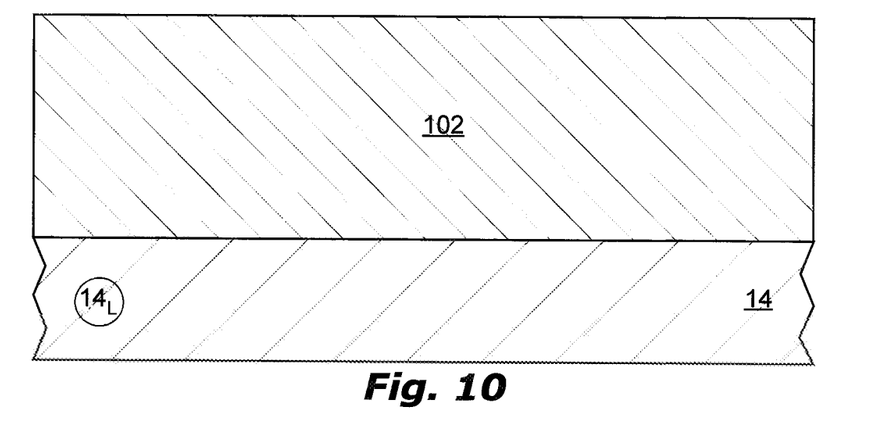
FIG. 10 is a schematic, cross-sectional side-view illustrating a step in a method of making a WGP, including applying film(s) 102 on top of the bottom protection layer $14_L$, in accordance with an embodiment of the present invention.

A step, illustrated in FIG. 10, includes applying film(s) 102 on top of the bottom protection layer $14_L$. For example, the film(s) 102 can be sputtered onto the bottom protection layer $14_L$. The film(s) 102 can include reflective layer(s), transparent layer(s), absorptive layer(s), or combinations thereof.

Figure 11:
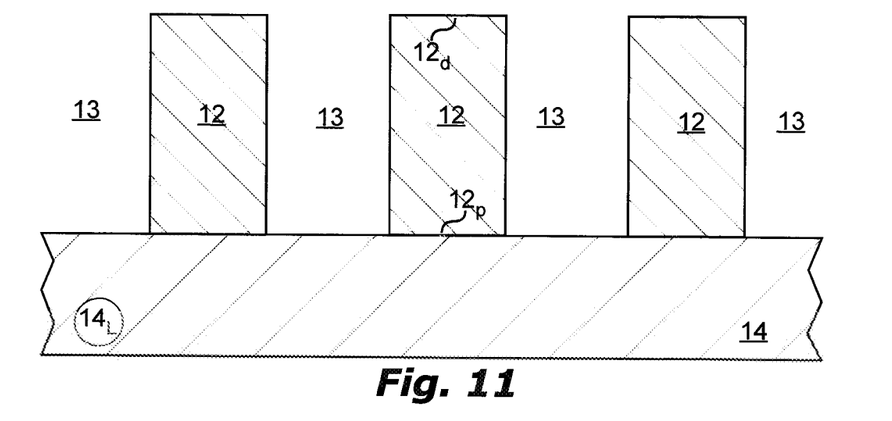
FIG. 11 is a schematic, cross-sectional side-view illustrating a step in a method of making a WGP, including etching the film(s) 102 to form an array of wires 12 and channels 13 between adjacent wires 12, in accordance with an embodiment of the present invention.
Figure 12:
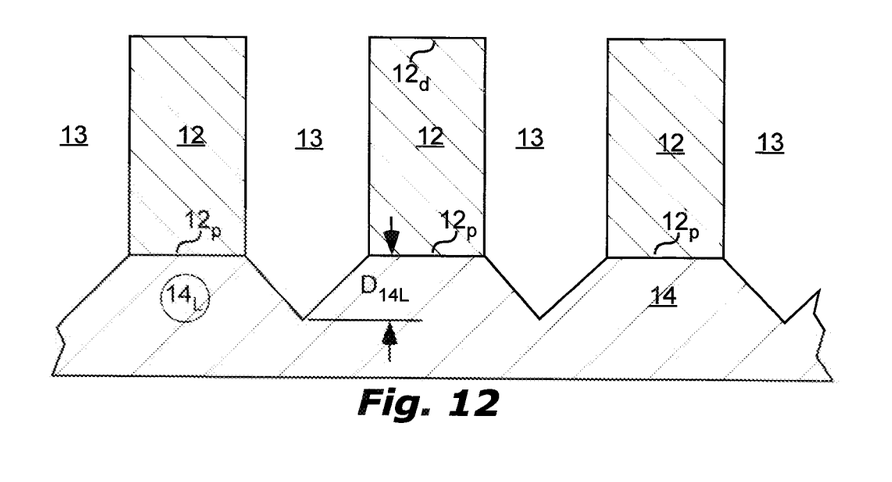
FIG. 12 is a schematic, cross-sectional side-view illustrating a step in a method of making a WGP, including etching beyond the proximal end $12_p$ of the wires 12 into the bottom protection layer $14_L$ for a depth $D_{14L}$, thus increasing the size of the channels 13, in accordance with an embodiment of the present invention.

A step, illustrated in FIG. 11, includes etching the film(s) 102 to form an array of wires 12 and channels 13 between adjacent wires 12. A step, illustrated in FIG. 12, includes etching beyond the proximal end $12_p$ of the wires 12 into the bottom protection layer $14_L$ for a depth $D_{14L}$, thus increasing the size of the channels 13.

Figure 13:
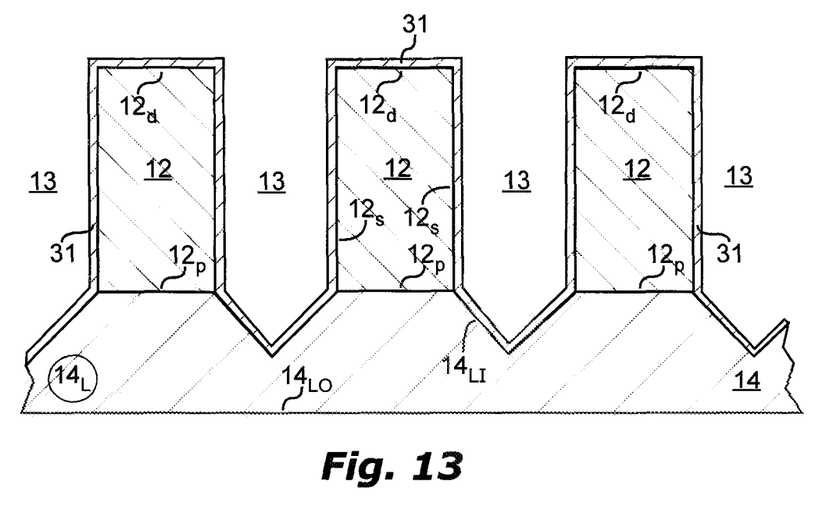
FIG. 13 is a schematic, cross-sectional side-view illustrating a step in a method of making a WGP, including applying a lower barrier-layer 31 to an exposed surface of the wires 12 and a surface $14_U$ of the bottom protection layer $14_L$ in the channels 13, or both, in accordance with an embodiment of the present invention.

A step, illustrated in FIG. 13, includes applying a lower barrier-layer 31. The lower barrier-layer 31 can be applied to an exposed surface of the wires 12 and a surface $14_{LI}$ of the bottom protection layer $14_L$ in the channels 13. The lower barrier-layer 31 can thus be applied to a distal end $12_d$ of the wires 12 farthest from the bottom protection layer $14_L$, a side-wall surface $12_s$ of the wires 12 in the channels 13, and a surface $14_U$ of the bottom protection layer $14_L$ in the channels 13. The lower barrier-layer 31 can be applied by in a conformal layer, such as by atomic layer deposition. The lower barrier-layer 31 can thus be a conformal coating, providing a thin layer of protection while retaining the channels 13 air-filled.

Figure 14:
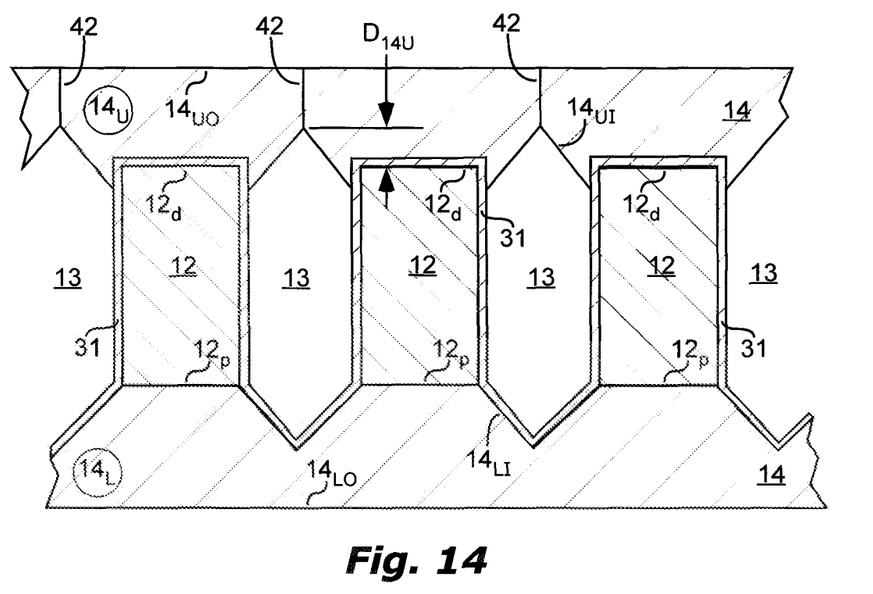
FIG. 14 is a schematic, cross-sectional side-view illustrating a step in a method of making a WGP, including applying a top protection layer $14_U$ at a distal end $12_d$ of the wires, and spanning the channels 13, in accordance with an embodiment of the present invention.

A step, illustrated in FIG. 14, includes applying a top protection layer $14_U$. The top protection layer $14_U$ can be applied, such as for example as described below, to span the channels and to keep the channels 13 air filled. The term "air filled" herein means that an air-filled channel remains, but such channel may be reduced in size by the top protection layer $14_U$ extending into the channels 13, such as for example partially along sides $12_s$ of the wires 12.

Further, by the method described below, the top protection layer $14_U$ on adjacent wires 12 can touch but retain a permeable junction 42 between the top protection layer $14_U$ on adjacent wires 12. Also, by the method described below, each channel 13 can extend beyond the distal end $12_d$ of the wires 12 into the top protection layer $14_U$ for a depth $D_{14U}$, thus increasing the size of the channels 13 and improving performance.

The top protection layer $14_U$ can be applied by sputter deposition. Following are example deposition conditions in order to achieve the properties described above. A pressure of the chamber can be 1-5 mTorr. Deposition temperature can be about 50° C. A mixture of $O_2$ gas and Ar gas, with a ratio of about 1:1, can blow through the chamber. Deposition can be performed with a bias voltage of about 1000 volts and power of 4000 watts. The wires can have a pitch P of about 100-140 nm, wire width $W_{12}$ of about 30-40 nm, wire thickness $T_{12}$ of about 250-300 nm, Deposition conditions can be adjusted to shape the top protection layer $14_U$. For example, bias voltage, gas flow rate, gas ratio, and chamber pressure can be adjusted to change the rate of deposition of the top protection layer $14_U$, and thus change its shape. The aforementioned conditions can vary depending on the sputter tool used, the type of target material, the type of sputter deposition, and desired shape of the top protection layer $14_U$.

Figure 15:
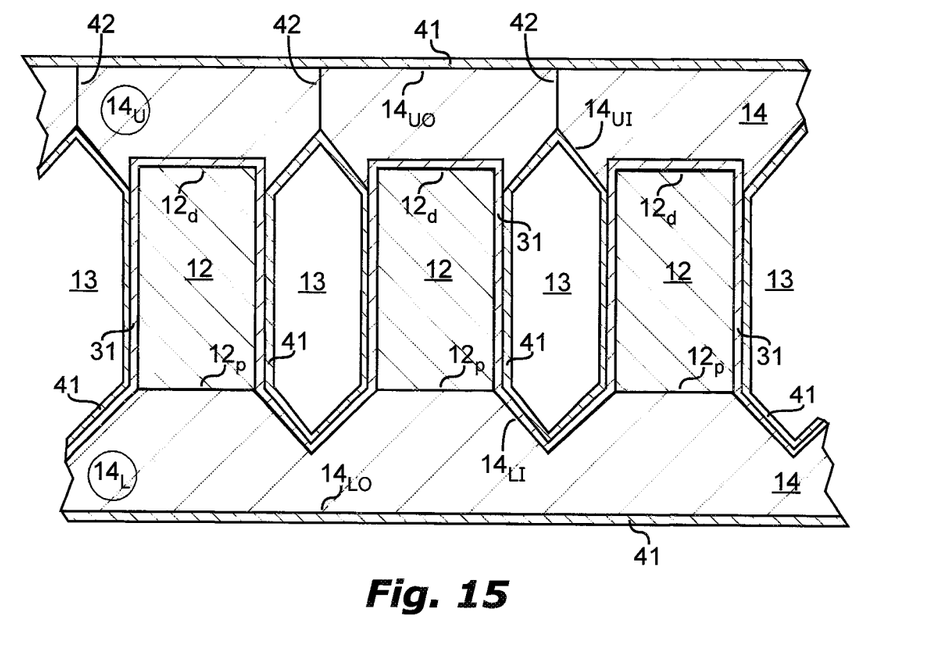
FIG. 15 is a schematic, cross-sectional side-view illustrating a step in a method of making a WGP, including applying an upper barrier-layer 41 at an outermost surface 14$_{UO}$ of the top protection layer 14$_U$, at an outermost surface 14$_{LO}$ of the bottom protection layer 14$_L$, at some or all surfaces of the channels 13, or combinations thereof, in accordance with an embodiment of the present invention.

A step, illustrated in FIG. 15, includes applying an upper barrier-layer 41. The upper barrier-layer 41 can be applied by various methods, including chemical vapor deposition. The upper barrier-layer 41 can be located at an outermost surface $14_{UO}$ of the top protection layer $14_U$, at an outermost surface $14_{LO}$ of the bottom protection layer $14_L$, at some or all surfaces of the channels 13, or combinations thereof. Locations where coverage is not desired can be blocked during deposition.

The upper barrier-layer 41 can enter and coat the channels 13 by entering through the permeable junctions 42 in the top protection layer $14_U$ between adjacent wires 12. Deposition conditions can be adjusted to allow or improve entrance of the upper barrier-layer 41 through the permeable junctions 42 into the channels 13. For example, the chemistry of the upper barrier-layer 41, in liquid phase, can be poured into a flask. This liquid can be pumped or drawn into a container attached to an oven containing the WGP. The oven can have a pressure and temperature for the chemistry to flash to vapor. For example, the oven can have a temperature of ≥100° C. and ≤200° C. and a pressure of ≥1 Torr and ≤3 Torr.

Chemistry used to apply the top protection layer 41 can include $Si(R^1)_i(R^3)_j$. i can be 1 or 2. j can be 1, 2, or 3. i+j can equal 4. $R^3$ and $R^1$ are described above. The $Si(R^1)_i(R^2)_j$ can be in a gaseous phase in the oven, then vapor deposited onto the WGP.

What is claimed is:

1. A wire grid polarizer (WGP) comprising:
an array of wires sandwiched between a bottom protection layer and a top protection layer;
channels between adjacent wires, the channels being air filled;
the top protection layer spans the channels; forms a continuous layer with the top protection layer on adjacent wires touching; and has permeable junctions, including a permeable junction between the top protection layer on adjacent wires;
a lower barrier-layer: located on the wires and the bottom protection layer inside of the channels in a conformal layer; not located between the bottom protection layer and the wires; not located at an outermost surface of the top protection layer; and including a metal oxide; and
an upper barrier-layer: located on surfaces of the channels as an outermost layer of solid material; located on an outermost surface of the top protection layer as an outermost layer of solid material; and including a hydrophobic chemical; and
the upper barrier-layer further comprises an amino phosphonate and the amino phosphonate is a lower layer in the upper barrier-layer.

2. A wire grid polarizer (WGP) comprising:
an array of wires sandwiched between a bottom protection layer and a top protection layer;
channels between adjacent wires, the channels being air filled;
the top protection layer spans the channels; forms a continuous layer with the top protection layer on adjacent wires touching; and has permeable junctions, including a permeable junction between the top protection layer on adjacent wires;
a lower barrier-layer: located on the wires and the bottom protection layer inside of the channels in a conformal layer; not located between the bottom protection layer and the wires; not located at an outermost surface of the top protection layer; and including a metal oxide;
an upper barrier-layer: located on surfaces of the channels as an outermost layer of solid material; located on an outermost surface of the top protection layer as an outermost layer of solid material; and including a hydrophobic chemical;
each wire of the array of wires includes a proximal end closest to the bottom protection layer and a distal end closest to the top protection layer;
each channel extends beyond the proximal end into the bottom protection layer for a depth of between 10 nm and 200 nm;
each channel extends beyond the distal end into the top protection layer for a depth of between 10 nm and 200 nm; and
a ratio of the depth into the bottom protection layer to the depth into the top protection layer is between 0.5 and 2.

3. The WGP of claim 2, wherein the upper barrier-layer is an outermost layer of solid material.

4. The WGP of claim 2, wherein:
the hydrophobic chemical includes a silane chemical, a phosphonate chemical, or both;
the silane chemical has chemical formula (1), chemical formula (2), or combinations thereof, and the phosphonate chemical has chemical formula (3):

where r is a positive integer, each $R^1$ independently is a hydrophobic group, each X and Z is a bond to the wires, and each $R^3$ and $R^5$ is independently a chemical element or a group.

5. The WGP of claim 2, wherein the upper barrier-layer further comprises an amino phosphonate, the amino phosphonate is a lower layer in the conformal coating, and the amino phosphonate is sandwiched between the hydrophobic chemical and the wires.

6. The WGP of claim 5, wherein the amino phosphonate is nitrilotri(methylphosphonic acid).

7. A wire grid polarizer (WGP) comprising:
an array of wires sandwiched between a bottom protection layer and a top protection layer;
channels between adjacent wires, the channels being air filled;
the top protection layer spans the channels; forms a continuous layer with the top protection layer on adjacent wires touching; and has permeable junctions, including a permeable junction between the top protection layer on adjacent wires;
a lower barrier-layer: located on the wires and the bottom protection layer inside of the channels in a conformal layer; not located between the bottom protection layer and the wires; not located at an outermost surface of the top protection layer; and including a metal oxide;
an upper barrier-layer: located on surfaces of the channels as an outermost layer of solid material; located on an outermost surface of the top protection layer as an outermost layer of solid material; and including a hydrophobic chemical;
the lower barrier-layer comprises two layers of different materials, including an oxidation-barrier and a moisture-barrier, with the oxidation-barrier between the moisture-barrier and the wires;
the oxidation-barrier is distinct from the wires and includes aluminum oxide, silicon oxide, silicon nitride, silicon oxynitride, silicon carbide, a rare earth oxide, or combinations thereof; and
the moisture-barrier includes hafnium oxide, zirconium oxide, a rare earth oxide different from the rare earth oxide of the oxidation-barrier, or combinations thereof.

8. The WGP of claim 7, wherein:
the hydrophobic chemical includes a silane chemical, a phosphonate chemical, or both;
the silane chemical has chemical formula (1), chemical formula (2), or combinations thereof, and the phosphonate chemical has chemical formula (3):

where r is a positive integer, each $R^1$ independently is a hydrophobic group, each X and Z is a bond to the wires, and each $R^3$ and $R^5$ is independently a chemical element or a group.

9. The WGP of claim 7, wherein the hydrophobic chemical includes $CF_3(CF_2)_n(CH_2)_m$, where $n \geq 1$ and $n \leq 8$, and $m \geq 1$ and $m \leq 4$.

10. The WGP of claim 7, wherein each of the wires includes a reflective layer sandwiched between a lower absorptive layer and an upper absorptive layer.

11. The WGP of claim 7, wherein the upper barrier-layer further comprises an amino phosphonate.

12. The WGP of claim 11, wherein the amino phosphonate comprises nitrilotri(methylphosphonic acid) (ATMP); and wherein a mass fraction of ATMP/hydrophobic chemical is $\geq 0.1$ and $\leq 10$.

13. A wire grid polarizer (WGP) comprising:
an array of wires sandwiched between a bottom protection layer and a top protection layer;
channels between adjacent wires;
the bottom protection layer and the top protection layer each comprise aluminum oxide;
a lower barrier-layer located at a surface of the wires in the channels, an exposed surface of the bottom protection layer in the channels, and between each wire and the top protection layer;
the lower barrier-layer comprises two layers of different materials, including an oxidation-barrier and a moisture-barrier, the oxidation-barrier being between the moisture-barrier and the wires;
the oxidation-barrier is distinct from the wires and includes aluminum oxide, silicon oxide, silicon nitride, silicon oxynitride, silicon carbide, a rare earth oxide, or combinations thereof; and
the moisture-barrier includes hafnium oxide, zirconium oxide, a rare earth oxide different from the rare earth oxide of the oxidation-barrier, or combinations thereof.

14. The WGP of claim 13, wherein:
the channels are air filled;
each wire of the array of wires includes a proximal end closest to the bottom protection layer and a distal end closest to the top protection layer;
each channel extends beyond the proximal end into the bottom protection layer for a depth of between 10 nm and 200 nm;
each channel extends beyond the distal end into the top protection layer for a depth of between 10 nm and 200 nm; and a ratio of the depth into the bottom protection layer to the depth into the top protection layer is between 0.5 and 2.

15. The WGP of claim 13, wherein the bottom protection layer and the top protection layer each comprise at least 90 weight percent aluminum oxide.

16. The WGP of claim 13, further comprising an upper barrier-layer located at an outermost surface of the top protection layer, the upper barrier-layer comprising an amino phosphonate and a hydrophobic chemical.

17. The WGP of claim 16, wherein the amino phosphonate is a lower layer in the conformal coating and is sandwiched between the hydrophobic chemical and the wires.

18. The WGP of claim 16, wherein the channels are air-filled and the upper barrier-layer is also located at a surface of the wires in the channels.

19. The WGP of claim 18 wherein the upper barrier-layer is not located between each wire and the top protection layer.

* * * * *